United States Patent
Kim et al.

(10) Patent No.: US 7,494,918 B2
(45) Date of Patent: Feb. 24, 2009

(54) SEMICONDUCTOR STRUCTURES INCLUDING MULTIPLE CRYSTALLOGRAPHIC ORIENTATIONS AND METHODS FOR FABRICATION THEREOF

(75) Inventors: Byeong Y. Kim, LaGrangeville, NY (US); Xiaomeng Chen, Poughkeepsie, NY (US); Judson R. Holt, Wappingers Falls, NY (US); Christopher D. Sheraw, Poughkeepsie, NY (US); Linda Black, Wappingers Falls, NY (US); Igor Peidous, Fishkill, NY (US)

(73) Assignees: International Business Machines Corporation, Armonk, NY (US); Advanced Micro Devices, Inc. (AMD), Sunnyvale, CA (US)

( * ) Notice: Subject to any disclaimer, the term of this patent is extended or adjusted under 35 U.S.C. 154(b) by 138 days.

(21) Appl. No.: 11/538,963

(22) Filed: Oct. 5, 2006

(65) Prior Publication Data
US 2008/0083952 A1    Apr. 10, 2008

(51) Int. Cl.
*H01L 21/4763*    (2006.01)
*H01L 29/04*    (2006.01)

(52) U.S. Cl. .................. 438/628; 257/627; 257/628; 438/150; 438/738; 438/739

(58) Field of Classification Search .......... 257/627–628; 438/38–739; 216/41, 72
See application file for complete search history.

(56) References Cited

U.S. PATENT DOCUMENTS

| | | | |
|---|---|---|---|
| 6,835,981 B2 | 12/2004 | Yamada et al. | |
| 6,949,420 B1 | 9/2005 | Yamashita | |
| 2004/0256700 A1* | 12/2004 | Doris et al. | 257/627 |
| 2006/0226495 A1* | 10/2006 | Kwon | 257/371 |
| 2006/0292834 A1* | 12/2006 | Lin et al. | 438/478 |

* cited by examiner

*Primary Examiner*—Matthew Smith
*Assistant Examiner*—Phillip Green
(74) *Attorney, Agent, or Firm*—Scully, Scott, Murphy & Presser P.C.; Todd M.C. Li, Esq.

(57) ABSTRACT

Semiconductor structures and methods for fabrication thereof are predicated upon epitaxial growth of an epitaxial surface semiconductor layer upon a semiconductor substrate having a first crystallographic orientation. The semiconductor substrate is exposed within an aperture within a semiconductor-on-insulator structure. The epitaxial surface semiconductor layer alternatively contacts or is isolated from a surface semiconductor layer having a second crystallographic orientation within the semiconductor-on-insulator structure. A recess of the semiconductor surface layer with respect to a buried dielectric layer thereunder and a hard mask layer thereover provides for inhibited second crystallographic phase growth within the epitaxial surface semiconductor layer.

7 Claims, 8 Drawing Sheets

SEMICONDUCTOR STRUCTURES INCLUDING MULTIPLE CRYSTALLOGRAPHIC ORIENTATIONS AND METHODS FOR FABRICATION THEREOF

BACKGROUND

1. Field of the Invention

The invention relates generally to semiconductor structures. More particularly, the invention relates to semiconductor structures having enhanced performance.

2. Description of the Related Art

As semiconductor technology advances, dimensions of semiconductor devices and semiconductor structures continue to decrease. As a result of this continued scaling of semiconductor device and semiconductor structure dimensions, it has become increasingly important within semiconductor technology to fabricate semiconductor devices with increasingly enhanced performance at continued decreased dimensions.

An additional trend within semiconductor technology that also provides enhanced semiconductor device performance is the fabrication of semiconductor devices upon different crystallographic orientation semiconductor substrates. Generally, particular crystallographic orientations are selected to optimize either electron mobility or hole mobility. For example, nFET devices are desirably fabricated upon 100 crystallographic orientation silicon containing semiconductor substrates to provide enhanced electron mobility, while pFET devices are desirable fabricated upon 110 crystallographic orientation silicon containing semiconductor substrates to provide enhanced hole mobility.

Examples of semiconductor structures fabricated using multiple crystallographic orientation substrates are known in the art.

For example, Yamada et al., in U.S. Pat. No. 6,835,981, teaches a semiconductor structure that includes both a bulk semiconductor region and a semiconductor-on-insulator (SOI) region. Within this prior art reference, the bulk semiconductor region and the SOI region are separated by an isolation region.

In addition, Yamashita in U.S. Pat. No. 6,949,420 teaches a silicon-on-insulator (SOI) semiconductor substrate having a plurality of surface crystallographic regions. Within this prior art reference, an oxygen ion implant method is used for forming a buried dielectric layer within one of the SOI regions.

Semiconductor device dimensions are certain to continue to decrease, and as a result thereof it is desirable to fabricate semiconductor devices with enhanced performance at decreased dimensions. To that end, additional semiconductor structures that are advantaged through use of multiple crystallographic orientation semiconductor substrates are desirable.

SUMMARY OF THE INVENTION

The invention provides semiconductor structures having multiple crystallographic orientations, and methods for fabricating the semiconductor structures.

A semiconductor structure in accordance with the invention includes a semiconductor substrate having a first crystallographic orientation. This particular semiconductor structure also includes a first surface semiconductor layer having the first crystallographic orientation and contacting the semiconductor substrate. This particular semiconductor structure also includes a second surface semiconductor layer having a second crystallographic orientation different than the first crystallographic orientation. The second surface semiconductor layer is vertically separated from the semiconductor substrate by a buried isolation region and laterally separated from the first surface semiconductor layer by an exposed isolation region. This particular semiconductor structure finally includes a first device located within the first surface semiconductor layer and a second device located within the second surface semiconductor layer. The first device and the second device are connected by a conductor layer located upon the exposed isolation region.

Another semiconductor structure in accordance with the invention also includes a semiconductor substrate having a first crystallographic orientation. This other semiconductor structure also includes a first surface semiconductor layer having the first crystallographic orientation and contacting the semiconductor substrate. This other semiconductor structure also includes a second surface semiconductor layer having a second crystallographic orientation different than the first crystallographic orientation. The second surface semiconductor layer laterally contacts the first surface semiconductor layer and is vertically separated from the semiconductor substrate by a buried isolation region. This other semiconductor structure also includes a first device located within the first surface semiconductor layer and a second device located within the second surface semiconductor layer. A contact region within the first device contacts a contact region within the second device.

A method for fabricating a semiconductor structure in accordance with the invention includes forming an aperture through a masking layer, a surface semiconductor layer and a buried dielectric layer to expose a semiconductor substrate within a semiconductor structure comprising the semiconductor substrate, the buried dielectric layer located thereupon, the surface semiconductor layer located thereupon and the masking layer located thereupon. This method also provides that the surface semiconductor layer has a recess with respect to the buried dielectric layer and the masking layer. This method also provides that the semiconductor substrate has a first crystallographic orientation and the surface semiconductor layer has a second crystallographic orientation different from the first crystallographic orientation. Finally, this method also includes growing an epitaxial surface semiconductor layer upon the semiconductor substrate within the aperture.

BRIEF DESCRIPTION OF THE DRAWINGS

The objects, features and advantages of the invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

The invention, which provides semiconductor structures and methods for fabricating the semiconductor structures, is described in further detail below within the context of the drawings that are described above. The drawings are intended for illustrative purposes, and as such they are not necessarily drawn to scale.

Attention is drawn to FIG. 1 to FIG. 12, which show a series of schematic cross-sectional diagrams illustrating the results of progressive stages in fabricating a semiconductor structure in accordance with an embodiment of the invention. This embodiment of the invention comprises a first embodiment of the invention.

Figure 1:
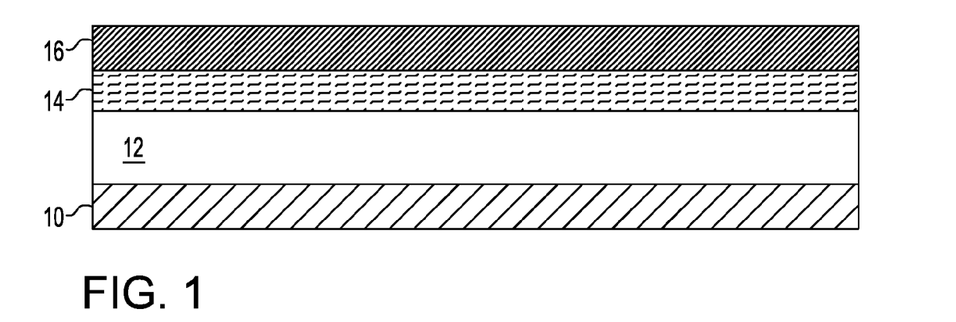
FIG. 1 to FIG. 12 show a series of schematic cross-sectional diagrams illustrating the results of progressive stages in fabricating a semiconductor structure in accordance with an embodiment of the invention.

FIG. 1 shows a semiconductor-on-insulator substrate which comprises: (1) a base semiconductor substrate 10; (2) a buried dielectric layer 12 located upon the base semiconductor substrate 10; and (3) a surface semiconductor layer 14 located upon the buried dielectric layer 12. FIG. 1 also shows a hard mask layer 16 located upon the surface semiconductor layer 14.

Each of the foregoing semiconductor substrate 10 and overlying layers 12/14/16 may comprise materials and have dimensions that are conventional in the semiconductor fabrication art. Each of the foregoing semiconductor substrate 10 and overlying layers 12/14/16 may be formed using methods that are conventional in the semiconductor fabrication art.

The semiconductor substrate 10 may comprise any of several semiconductor materials. Non-limiting examples include silicon, germanium, silicon-germanium alloy, silicon carbide, silicon-germanium carbide alloy and compound semiconductor materials. Non-limiting examples of compound semiconductor materials include gallium arsenide, indium arsenide and indium phosphide semiconductor materials. Typically, the semiconductor substrate 10 has a thickness from about 0.5 to about 1.5 mm.

The buried dielectric layer 12 may similarly comprise any of several dielectric materials. The dielectric materials may be crystalline dielectric materials or non-crystalline (i.e., amorphous) dielectric materials. Non-limiting example of dielectric materials include oxides, nitrides and oxynitrides of silicon. Oxides, nitrides and oxynitrides of other elements are not excluded. The dielectric material from which is comprised the buried dielectric layer 12 may be formed using any of several methods. Included are thermal or plasma oxidation or nitridation methods, chemical vapor deposition methods (including atomic layer deposition methods) and physical vapor deposition methods (including sputtering methods). Typically, the buried dielectric layer 12 comprises at least in part a silicon oxide material that has a thickness from about 200 to about 2000 angstroms.

The surface semiconductor layer 14 (which will be designated as a second surface semiconductor layer within the context of the claimed invention) may comprise any of the several semiconductor materials from which may be comprised the semiconductor substrate 10. However, the surface semiconductor layer 14 has a different crystallographic orientation in comparison with the semiconductor material from which is comprised the semiconductor substrate 10. The surface semiconductor layer 14 may comprise the same semiconductor material as the semiconductor substrate 10 or a different semiconductor material from the semiconductor substrate 10.

The hard mask layer 16 may comprise any of several hard mask materials. Similarly with the buried dielectric layer 12, non-limiting examples include oxides, nitrides and oxynitrides of silicon. Nitride hard mask materials are particularly common, but by no means limit the invention. The hard mask materials may in general be formed using methods analogous, equivalent or identical to the methods that are used for forming the buried dielectric layer 12. Typically, the hard mask layer 16 comprises a nitride hard mask material that has a thickness from about 500 to about 1500 angstroms.

Figure 2:
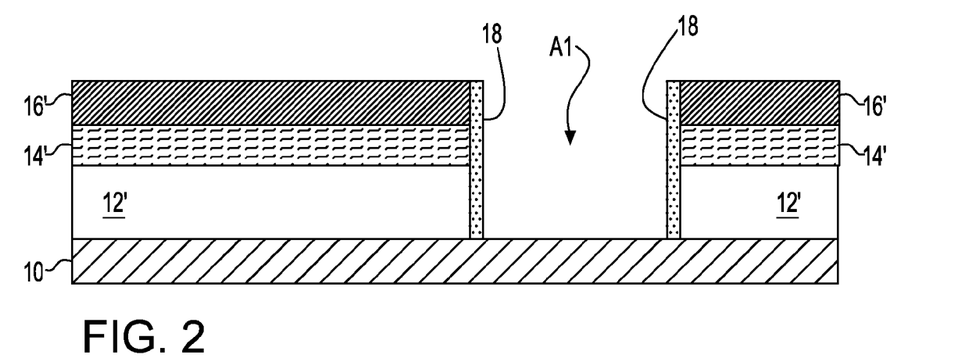

FIG. 2 shows an aperture A1 etched through the hard mask layer 16, the surface semiconductor layer 14 and the buried dielectric layer 12, to form a hard mask layer 16', a surface semiconductor layer 14' and a buried dielectric layer 12'. The aperture A1 reaches the semiconductor substrate 10. The aperture A1 is typically etched using a plasma etch method, so that the sidewalls of the foregoing buried dielectric layer 12', surface semiconductor layer 14' and hard mask layer 16' are perpendicular, or nearly so. Certain wet chemical etch methods may alternatively be used, but they are generally not common. Generally, plasma etch methods will typically use a chlorine containing etchant gas composition for etching the surface semiconductor layer 14 when the surface semiconductor layer 14 comprises a silicon containing semiconductor material. Plasma etch methods will also use a fluorine containing etchant gas composition for etching through the hard mask layer 16 or the buried dielectric layer 12 when either of the hard mask layer 16 or the buried dielectric layer 12 comprises a silicon containing dielectric material.

FIG. 2 also shows a spacer isolation layer 18 (i.e., spacer isolation region) located adjoining sidewalls of the aperture A1. The spacer isolation layer 18 may comprise any of several dielectric materials selected from the same group of dielectric materials as the buried dielectric layer 12 and the hard mask layer 16, but will generally comprise a dielectric material of composition different than the hard mask layer 16. The spacer isolation layer 18 is formed using a blanket layer deposition and an anisotropic etch method that is generally conventional in the semiconductor fabrication art.

Figure 3:
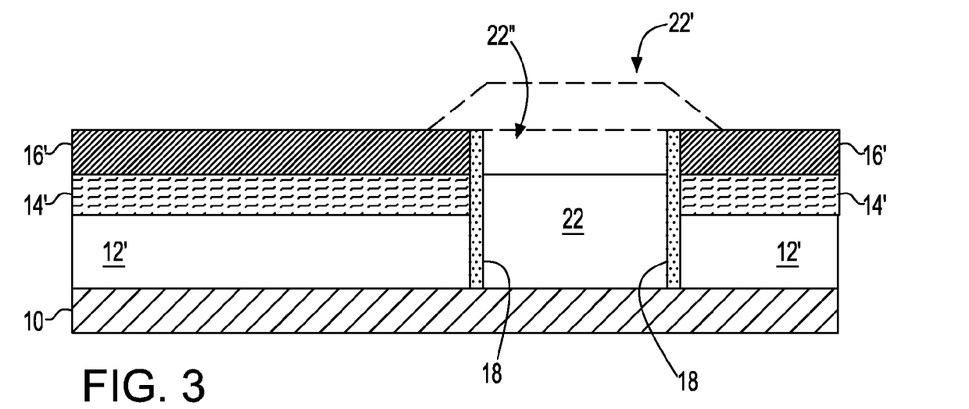

FIG. 3 shows the results of growing an epitaxial surface semiconductor layer 22 (designated as a first surface semiconductor layer within the context of the invention as claimed) within the aperture A1. The dashed line that corresponds with reference numeral 22' illustrates a maximum overgrowth (i.e., a surface dimension) of the epitaxial surface semiconductor layer 22, to provide an overgrown epitaxial surface semiconductor layer which encroaches upon and over the hard mask layer 16'. Subsequent to such overgrowth and encroachment, the overgrown epitaxial surface semiconductor layer whose surface dimension corresponds with reference numeral 22' is planarized and then etched back to a recess beneath the hard mask layer 16'.

The dashed line that corresponds with reference numeral 22" illustrates a surface dimension of a planarized epitaxial surface semiconductor layer that results from planarizing the overgrown epitaxial surface semiconductor layer whose surface dimension is designated by reference numeral 22'. The planarization may be effected using methods including but not limited to: mechanical planarizing methods and chemical mechanical polish planarizing methods. Chemical mechanical polish planarizing methods are particularly common.

The subsequent etching back of the planarized epitaxial surface semiconductor layer whose surface dimension corresponds with reference numeral 22" to form the epitaxial surface semiconductor layer 22 may be effected using methods including but not limited to: wet chemical etch methods and dry plasma etch methods.

The epitaxial surface semiconductor layer 22 comprises a semiconductor material selected from the same group of semiconductor materials as the semiconductor substrate 10 and the surface semiconductor layer 14. The epitaxial surface semiconductor layer 22 may comprise the same semiconductor material as the semiconductor substrate 10, or a different semiconductor material in comparison with the semiconductor substrate 10. Within the embodiment and the invention, the surface semiconductor layer 14' has a second crystallographic orientation and the epitaxial surface semiconductor layer 22 has a first crystallographic orientation (i.e., typically 110) different than the second crystallographic orientation (i.e., typically 100). The epitaxial surface semiconductor layer 22 is deposited using an epitaxial chemical vapor deposition method.

The epitaxial surface semiconductor layer 22 may be selectively deposited and grown with respect to other surrounding layers while using a mixture of a silicon containing gas (e.g., silane ($SiH_4$) or dichlorosilane ($SiH_2Cl_2$)) in hydrogen at an ambient temperature from about 750° to about 1000° C. and an ambient pressure from about 100 mTorr to about 100 Torr. The overgrowth of the epitaxial surface semiconductor layer 22 to form the overgrown epitaxial surface semiconductor layer whose surface dimension is designated by reference numeral 22' typically facilitates the chemical mechanical polish (CMP) planarizing of the overgrown epitaxial surface semiconductor layer.

Figure 4:
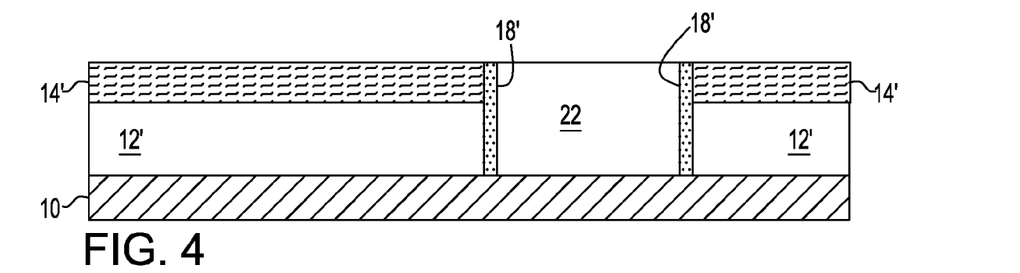

FIG. 4 shows the results of stripping the hard mask layer 16' from the semiconductor structure of FIG. 3. Incident to stripping the hard mask layer 16', spacer isolation layers 18' are also formed from spacer isolation layers 18.

The hard mask layer 16' may be stripped using methods and materials that are conventional in the semiconductor fabrication art. Non-limiting examples include wet chemical stripping methods, dry plasma stripping methods and aggregate stripping methods thereof.

Figure 5:
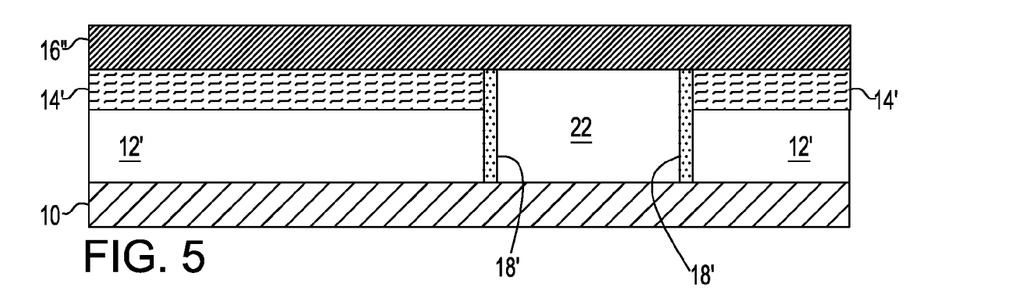

FIG. 5 shows the results of forming a hard mask layer 16" upon the semiconductor structure of FIG. 4. The hard mask layer 16" spans the surface semiconductor layer 14', the epitaxial surface semiconductor layer 22 and the spacer isolation layers 18'. The hard mask layer 16" may comprise materials, have dimensions and be formed using methods that are generally analogous to the materials, thicknesses and methods used in conjunction with the hard mask layer 16 that is illustrated in FIG. 1.

Figure 6:
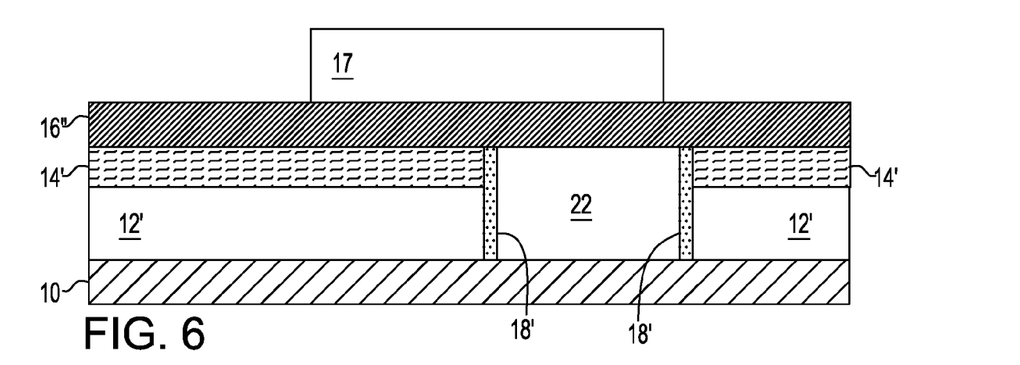

FIG. 6 shows a photoresist layer 17 located upon the hard mask layer 16" at a location that spans the surface semiconductor layer 14' and the epitaxial surface semiconductor layer 22. The photoresist layer 17 may comprise any of several photoresist materials. Non-limiting examples include positive photoresist materials, negative photoresist materials and hybrid photoresist materials. Typically the photoresist layer 17 comprises either a positive photoresist material of a negative photoresist material that has a thickness from about 5000 to about 20000 angstroms.

Figure 7:
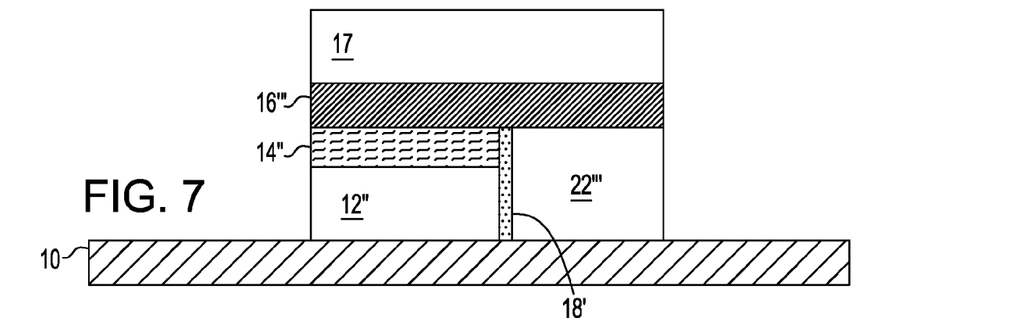

FIG. 7 shows the results of etching the hard mask layer 16", the surface semiconductor layer 14', the buried dielectric layer 12' and the epitaxial surface semiconductor layer 22 while using the photoresist layer 17 as an etch mask layer. Prior to this etching step, the photoresist layer is subjected to a lithographic process which patterns the photoresist layer 17. The foregoing etching forms a corresponding hard mask layer 16'", surface semiconductor layer 14", buried dielectric layer 12" and epitaxial surface semiconductor layer 22'". As a result of the foregoing etching, one of the spacer isolation layers 18' is also stripped from the semiconductor structure of FIG. 6 to provide the semiconductor structure of FIG. 7.

The foregoing etching is preferably undertaken using a plasma etch method that uses: (1) a fluorine containing etchant gas composition for etching silicon containing dielectric materials; and (2) a chlorine containing etchant gas composition for etching silicon containing semiconductor materials. Other methods and materials may alternatively be used.

Figure 8:
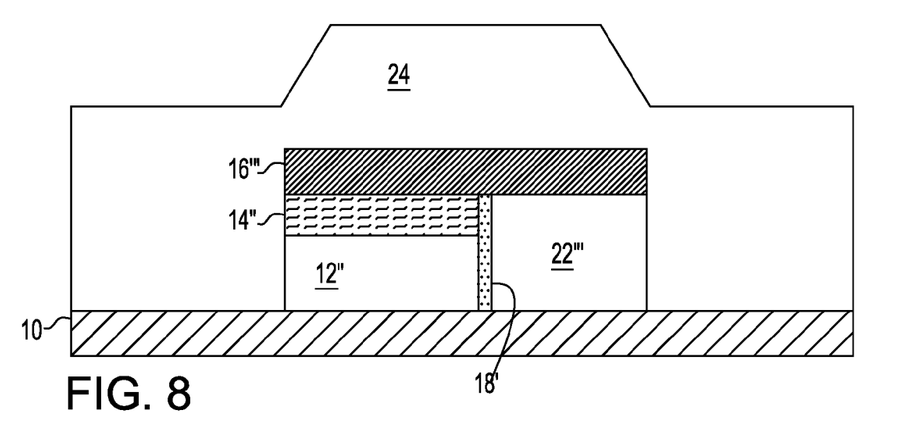

FIG. 8 first shows the results of stripping the photoresist layer 17 from the semiconductor structure of FIG. 7. The photoresist layer 17 may be stripped using methods and materials that are conventional in the semiconductor fabrication art. Included are wet chemical stripping methods, dry plasma stripping methods and aggregates of wet chemical stripping methods and dry plasma stripping methods.

FIG. 8 also shows the results of forming an isolation material layer 24 upon the semiconductor structure of FIG. 7, after having removed the photoresist layer 17. The isolation material layer 24 may be formed from any of several isolation materials. Non-limiting examples of isolation materials include oxides, nitrides and oxynitrides of silicon. Oxides, nitrides and oxynitrides of other elements are not excluded. The isolation material layer 24 may also be formed using any of several methods. Non-limiting examples include spin-on methods, chemical vapor deposition methods and physical vapor deposition methods.

Typically, the isolation material layer 24 comprises at least in part a silicon oxide material. Typically, the isolation material layer 24 has a thickness from about 2000 to about 5000 angstroms.

Figure 9:
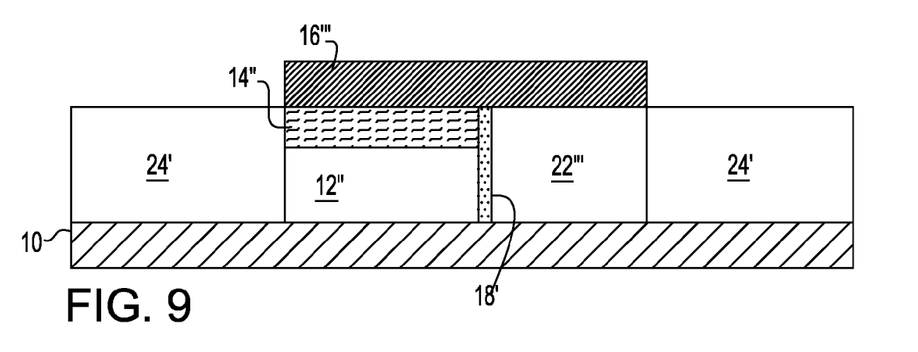

FIG. 9 first shows the results of planarizing the isolation material layer 24 while using the hard mask layer 16'" as a planarizing stop layer. FIG. 9 also shows the results of subsequently etching back the planarized isolation material layer 24 to the level of the surface semiconductor layer 14" and the epitaxial surface semiconductor layer 22'" to thus form isolation regions 24'. The foregoing planarizing and etching back may be undertaken using methods (i.e., a sequential overgrowth, planarization and etchback method) analogous to the methods that are used for forming the epitaxial surface semiconductor layer 22 that is illustrated in FIG. 3. Typically the planarizing is effected using a mechanical planarizing method or a chemical mechanical polish planarizing method. Typically, the etching back is affected using a wet chemical etching method. The embodiment is not, however, limited to the foregoing process sequence or process methodology.

Figure 10:
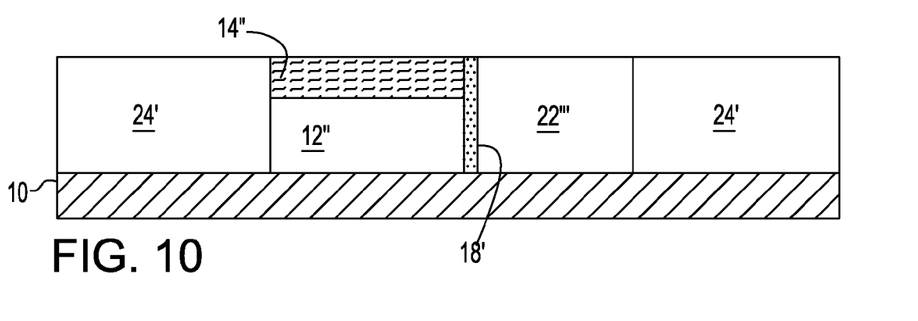

FIG. 10 shows the results of stripping the hard mask layer 16'" from the semiconductor structure of FIG. 9. The hard mask layer 16'" may be stripped using methods and materials analogous or equivalent to the methods and materials that are used for stripping the hard mask layer 16' that is illustrated in the semiconductor structure of FIG. 3 to provide in part the semiconductor structure that is illustrated in FIG. 4.

Figure 11:
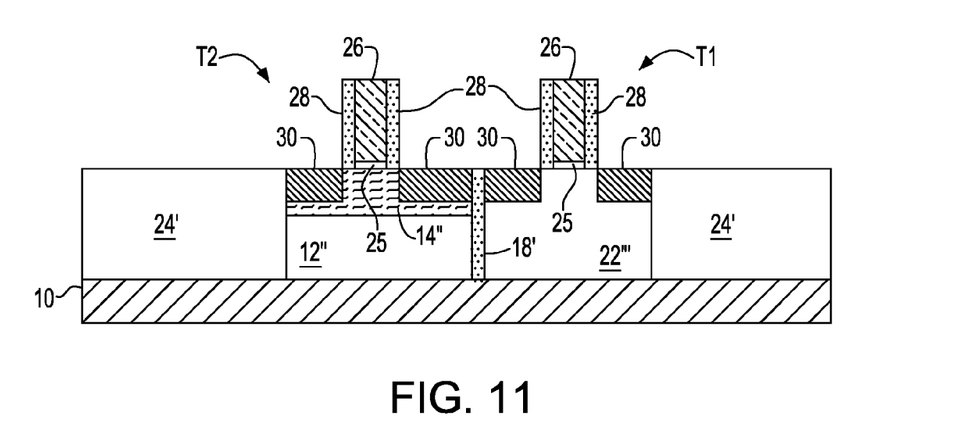

FIG. 11 shows a field effect transistor device T2 located within the surface semiconductor layer 14" and a field effect transistor device T1 located within epitaxial surface semiconductor layer 22'". The field effect transistor devices T1 and T2 comprise a pair of gate dielectrics 25. A pair of gate electrodes 26 is located upon the pair of gate dielectrics 25. A plurality of spacers 28 is located adjoining the gate electrodes 26. A plurality of source/drain regions 30 is located within the surface semiconductor layer 14" and the epitaxial surface semiconductor layer 22'".

Each of the foregoing layers and structures that comprise the field effect transistor devices T1 and T2 may comprise materials, have dimensions and be formed using methods that are conventional in the semiconductor fabrication art.

The gate dielectrics 25 may comprise generally conventional gate dielectric materials such as oxides, nitrides and oxynitrides of silicon having a dielectric constant from about 4 to about 20, measured in vacuum. The gate dielectrics 25 may alternatively comprise generally higher dielectric constant gate dielectric materials having a dielectric constant from about 20 to at least about 100, measured in vacuum. These generally higher dielectric constant gate dielectric materials may include, but are not limited to hafnium oxides, hafnium silicates, titanium oxides, lanthanum oxides, barium-strontium titanates (BSTs) and lead-zirconate titanates (PZTs). At least some of the foregoing gate dielectric materials may be deposited in either a crystalline phase or a non-crystalline phase.

The foregoing gate dielectric materials may be formed using methods that are conventional in the semiconductor fabrication art, and appropriate to individual materials of composition. Included are thermal or plasma oxidation or nitridation methods, chemical vapor deposition methods and physical vapor deposition methods. Typically, the gate dielectrics 25 comprise silicon containing gate dielectric material having a thickness from about 10 to about 70 angstroms.

The gate electrodes 26 may comprise any of several gate electrode materials. Non-limiting examples include are certain metals, metal alloys, doped polysilicon and polycide gate electrode materials. Also included as non-limiting examples are metal nitride gate electrode materials and metal silicide gate electrode materials. The foregoing gate electrode materials may also be formed using methods that are conventional in the semiconductor fabrication art, and appropriate to particular gate electrode material compositions. Included are plating methods, chemical vapor deposition methods (including atomic layer chemical vapor deposition methods) and physical vapor deposition methods (including sputtering methods). Typically, the gate electrodes 26 comprise a metal material, doped polysilicon material or polycide material having a thickness from about 500 to about 1500 angstroms.

The spacers 28 (which are intended as encircling individual gates 26 in plan view) typically comprise dielectric materials, although spacers are also known to be comprised of conductor materials. The dielectric materials may be selected from the same group of dielectric materials that are used for forming the buried dielectric layer 12. Also included are laminates and composites of those dielectric materials. Spacers 28 are typically formed using a blanket layer deposition and anisotropic etchback method that provides the spacers 28 with a characteristic spacer shape located adjoining sidewalls of the gates 26.

Finally, the source/drain regions 30 are formed into the exposed portions of the surface semiconductor layer 14" and the epitaxial surface semiconductor layer 22'". The source/drain regions 30 are typically formed using a two step ion implantation method. The two step ion implantation method comprises a first step that uses the gate electrodes 26 as a mask to form extension regions into the surface semiconductor layer 14" and the epitaxial surface semiconductor layer 22'". A second step within the two step ion implantation method uses the gates 26 with their corresponding spacers 28 as a mask to form contact region portions of the source/drain regions 30. Typical dopant concentrations within the source/drain regions are from about 1e18 to about 1e22 dopant atoms per cubic centimeter. Polarities of dopants are selected in accordance with polarities of transistors T1 and T2 desired to be fabricated.

Figure 12:
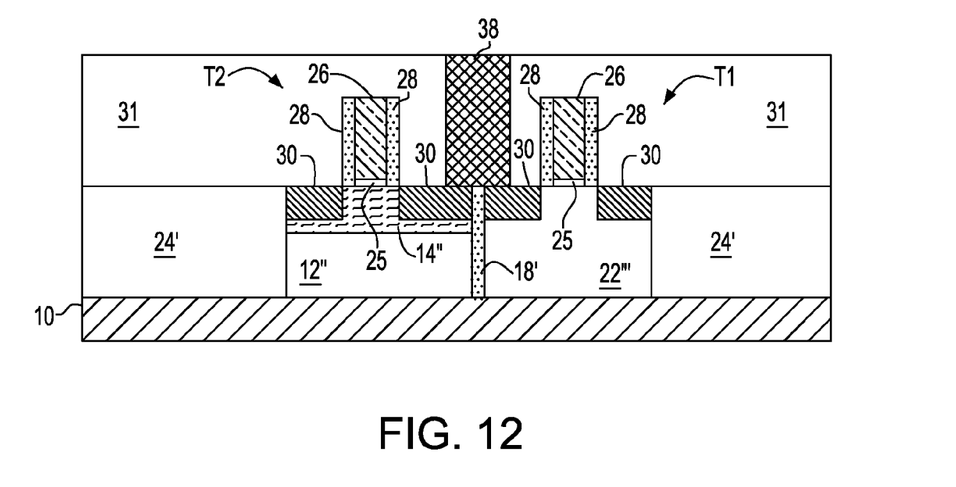

FIG. 12 first shows a planarized dielectric layer 31 located upon the semiconductor structure of FIG. 11. The planarized dielectric layer 31 comprises an aperture that exposes source/drain regions 30 within the transistor T1 and the transistor T2 that are separated by the isolation spacer layer 18'. Located within the aperture is a conductor strapping layer 32 upon the isolation spacer layer 18' and connecting to the source/drain regions 30 separated by the isolation spacer layer 18'.

The planarized dielectric layer 31 may comprise any of several dielectric materials. Non-limiting examples include oxides, nitrides and oxynitrides of silicon. Oxides, nitrides and oxynitrides of other elements are not excluded. The conductor strapping layer 32 may comprise any of several conductor materials. Generally, conductor materials which comprise the conductor strapping layer 32 are analogous, equivalent or identical to the conductor materials from which may be comprised the gates 26. Typically, the conductor strapping layer 32 comprises a polysilicon conductor material that has a thickness from about 500 to about 1500 angstroms.

Although not specifically illustrated in FIG. 12, the conductor strapping layer 32 may be formed simultaneously with contact studs that contact source/drain regions 30 within the transistor T1 and the transistor T2. Under such circumstances, when an additional dielectric layer is formed and located covering the planarized dielectric layer 31 and the conductor strapping layer 32, the additional dielectric layer may be patterned to provide contact to the contact studs but not necessarily the conductor strapping layer 32.

FIG. 12 shows a schematic cross-sectional diagram of a semiconductor structure in accordance with a first embodiment of the invention. The semiconductor structure comprises a semiconductor substrate 10 having a first crystallographic orientation. An epitaxial surface semiconductor layer 22'" that comprises a first surface semiconductor layer having the first crystallographic orientation contacts the semiconductor substrate 10. The semiconductor structure also comprises a surface semiconductor layer 14" that comprises a second surface semiconductor layer that has a second crystallographic orientation different from the first crystallographic orientation. The surface semiconductor layer 14" is separated from the semiconductor substrate 10 by a buried dielectric layer 12" and separated from the epitaxial surface semiconductor layer 22'" by the spacer isolation layer 18' (i.e., an isolation region), a portion of which is exposed. The semiconductor structure also comprises a first device T1 located within the epitaxial surface semiconductor layer 22'" and a second device T2 located within the surface semiconductor layer 14". Finally, the first device T1 and the second device T2 are connected using a conductor strapping layer 32 that spans the isolation spacer layer 18'.

The semiconductor structure of FIG. 12 provides enhanced performance insofar as the semiconductor structure of FIG. 12 comprises regions of different crystallographic orientation upon which separate devices, such as pFET and nFET devices, may be fabricated.

FIG. 13 to FIG. 18 show a series of schematic cross-sectional diagrams illustrating the results of progressive stages in fabricating a semiconductor structure in accordance with another embodiment of the invention. This other embodiment of the invention comprises a second embodiment of the invention.

Figure 13:
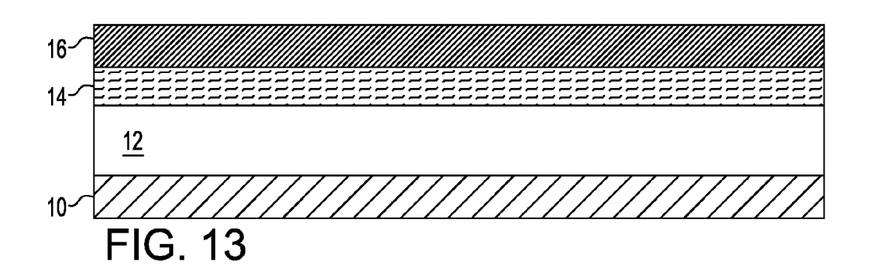
FIG. 13 to FIG. 18 show a series of schematic cross-sectional diagrams illustrating the results of progressive stages in fabricating a semiconductor structure in accordance with another embodiment of the invention.

FIG. 13 corresponds with FIG. 1, with identical reference numerals corresponding with identical structures and identical layers.

Figure 14:
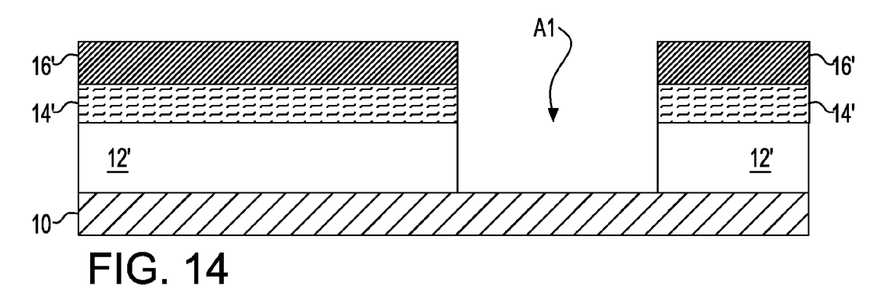

FIG. 14 corresponds with FIG. 2, but with absence of the isolation spacer layers 18.

Figure 15:
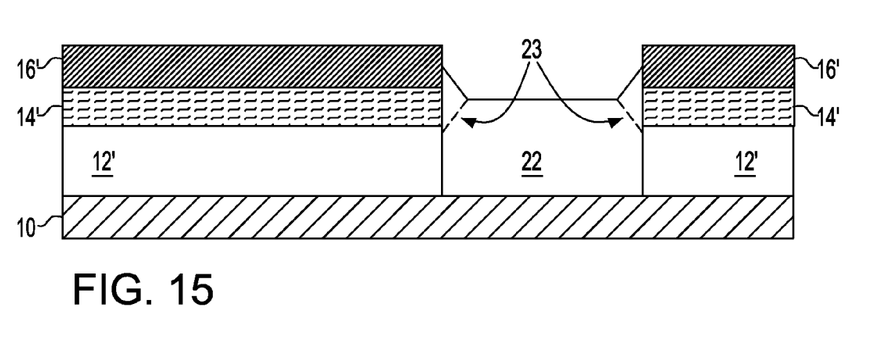

FIG. 15 shows the results of growing the first surface semiconductor layer 22 epitaxially upon the semiconductor substrate 10. The first surface semiconductor layer 22 grows epitaxially from both the semiconductor substrate 10 and the surface semiconductor layer 14'.

FIG. 15 also shows the interfacial lines 23 where the first crystallographic plane of the semiconductor substrate 10 meets the second crystallographic plane of the surface semiconductor layer 14'.

Figure 16:
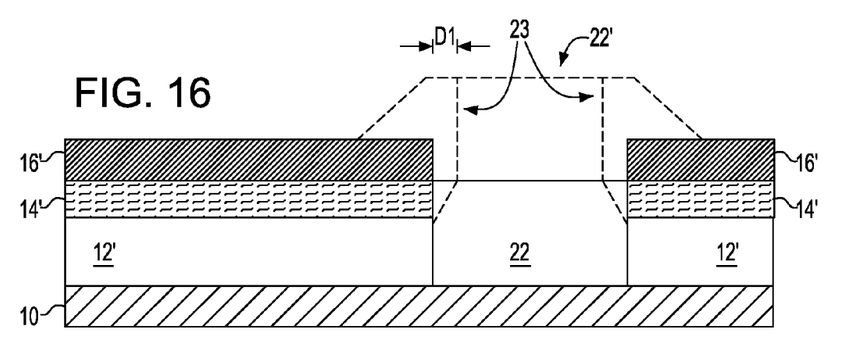

FIG. 16 shows the results of further growth of the epitaxial surface semiconductor layer 22 to the point of the same overgrowth line 22' that is shown in the schematic diagram of FIG. 3. Within FIG. 16, the interface lines 23 extend into the epitaxial surface semiconductor layer 22 for a distance D1 about the thickness of the surface semiconductor layer 14.

Figure 17:
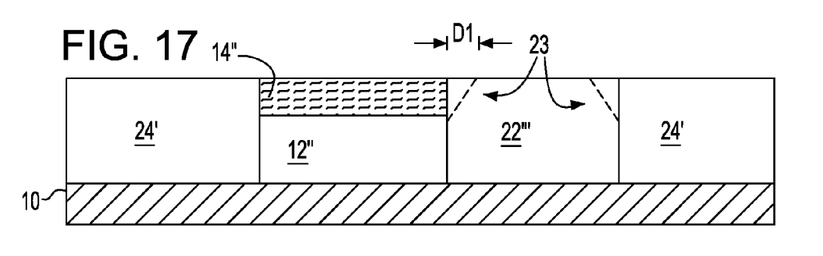

FIG. 17 shows a schematic cross-sectional diagram generally analogous with the schematic cross-sectional diagram of FIG. 10, but absent the spacer isolation layer 18' interposed between the epitaxial surface semiconductor layer 22''' and the surface semiconductor layer 14''. The semiconductor structure of FIG. 17 may be formed from the semiconductor structure of FIG. 16 using a sequence of processing steps that corresponds generally to the processing steps that are outlined in FIG. 4 to FIG. 10.

Figure 18:
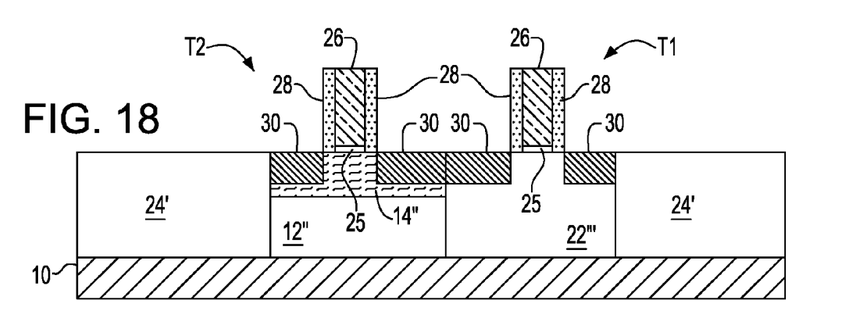

FIG. 18 shows a schematic cross-sectional diagram generally analogous with the schematic cross-sectional diagram of FIG. 1, but also absent the spacer isolation layer 18'. Thus, within FIG. 18 a source/drain region 30 within transistor T1 contacts a source/drain region 30 within transistor T2, and there is no need for a conductor strapping layer such as the conductor strapping layer 32. Due to the absence of such a conductor strapping layer, a distance between transistor T1 and transistor T2 may be reduced, resulting in an enhanced level of integrated circuit integration.

FIG. 18 shows a schematic cross-sectional diagram of a semiconductor structure in accordance with a second embodiment of the invention. The semiconductor structure has a first transistor T1 located within an epitaxial surface semiconductor layer 22''' that comprises a first surface semiconductor layer having a first crystallographic orientation. The semiconductor structure also comprises a second transistor T2 located within a surface semiconductor layer 14'' that comprises a second surface semiconductor layer having a second crystallographic orientation different from the first crystallographic orientation. Within the second embodiment of the invention, a source/drain region 30 within the first transistor T1 contacts a source/drain region 30 within the second transistor T2, thus providing a conductor connection.

Since source/drain regions within transistors are typically heavily doped, a natural conductor connection is made even with two different types of source/drain polarities. In addition, contact of silicided source/drain regions provides ohmic contact independent of source/drain polarity. Typically, the first transistor T1 and the second transistor T2 are of different polarities that benefit specifically from the first crystallographic orientation and the second crystallographic orientation of the surface semiconductor layers upon which they are located. Typically, the first crystallographic orientation is a 110 crystallographic orientation for which a pFET as transistor T1 benefits. Typically, the second crystallographic orientation is a 100 crystallographic orientation for which an nFET as transistor T2 benefits.

Figure 19:
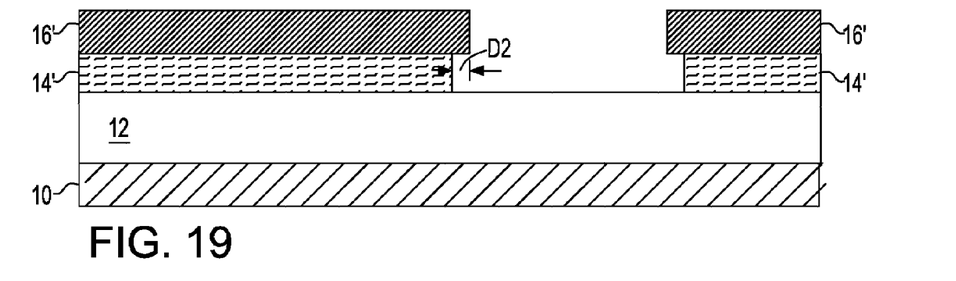
FIG. 19 to FIG. 24 show a series of schematic cross-sectional diagrams illustrating the results of progressive stages in fabricating a semiconductor structure in accordance with yet another embodiment of the invention.

FIG. 19 to FIG. 24 show a series of schematic cross-sectional diagrams of a semiconductor structure that illustrate the results of forming an epitaxial surface semiconductor layer in accordance with a third embodiment of the invention. FIG. 19 shows a schematic cross-sectional diagram of the semiconductor structure at an early stage in the fabrication thereof in accordance with the third embodiment of the invention.

FIG. 19 shows the semiconductor substrate 10. The buried dielectric layer 12 is located upon the semiconductor substrate 10. A surface semiconductor layer 14''' is located upon the buried dielectric layer 12'. A hard mask layer 16' is located upon the surface semiconductor layer 14'''.

Fabrication of the semiconductor structure of FIG. 19 starts with the semiconductor structure of FIG. 1 or FIG. 13. The hard mask layer 16' is patterned from the hard mask layer 16 that is illustrated in FIG. 1 or FIG. 13. In turn, the hard mask layer 16' is used as a mask for forming the surface semiconductor layer 14'''. The surface semiconductor layer 14''' is formed using at least in part an isotropic etch method that provides the undercut of the surface semiconductor layer 14''' under the hard mask layer 16'. Typically, the undercut of the surface semiconductor layer 14''' beneath the hard mask layer 16' is for a distance D2 from about one-half the thickness of the surface semiconductor layer 14''' to a full thickness of the surface semiconductor layer 14'''.

Figure 20:
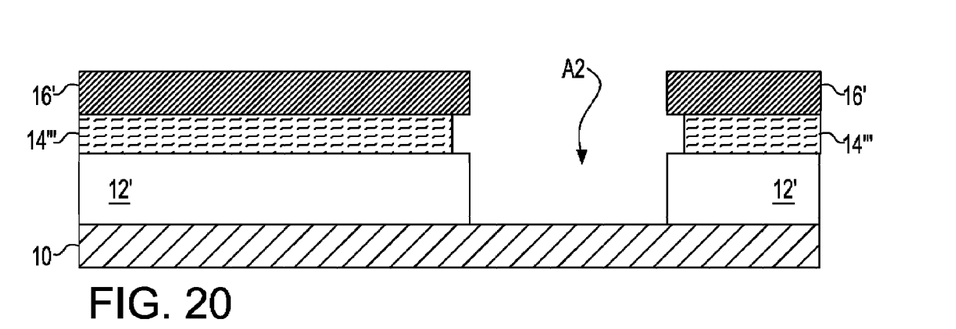

As is illustrated in FIG. 20, after forming the surface semiconductor layer 14''', the hard mask 16' may be used as an etch mask within an anisotropic method when etching the buried dielectric layer 12 to form the buried dielectric layer 12'. The etching also forms an aperture A2.

Figure 21:
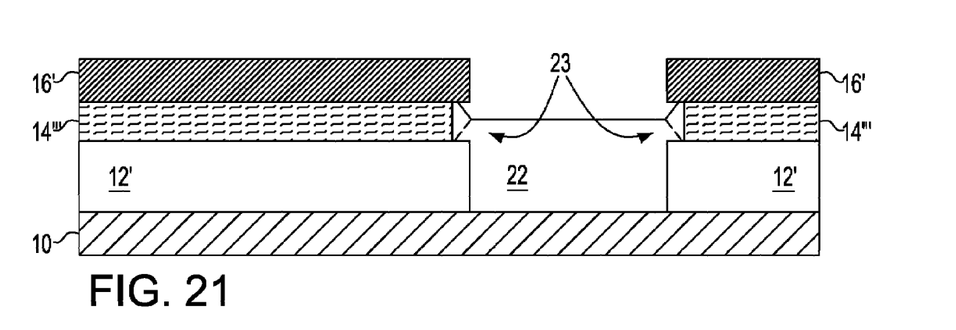

FIG. 21 shows the results of growing an epitaxial surface semiconductor layer 22 within the aperture A2 that is illustrated in FIG. 14. In accordance with embodiments above, the epitaxial surface semiconductor layer 22 is grown using an epitaxial chemical vapor deposition method. Similarly with the second embodiment of the invention as disclosed above, the epitaxial surface semiconductor layer 22 grows epitaxially from both the surface of the semiconductor substrate 10, as well as the exposed endwalls of the surface semiconductor layer 14'''.

FIG. 21 also shows the dislocation lines 23 (i.e., interfacial lines) for forming the epitaxial surface semiconductor surface layer 22. The dislocation lines 23 separate the first crystallographic orientation material that grows from the semiconductor substrate 10 from a second crystallographic orientation material that grows from the surface semiconductor layer 14'''.

Figure 22:
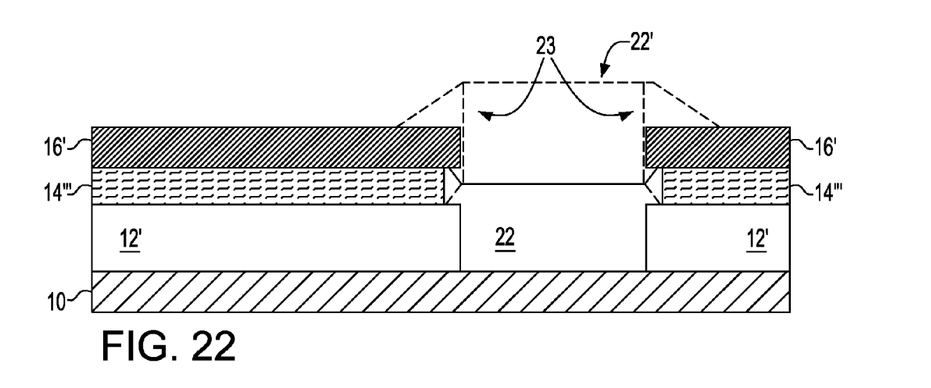

FIG. 22 shows a schematic cross-sectional diagram illustrating the results of further processing of the semiconductor structure whose schematic cross-sectional diagram is illustrated in FIG. 15.

FIG. 22 shows the results of further growth of the epitaxial surface semiconductor layer 22 to the dimensions of the overgrown epitaxial surface semiconductor layer 22'. The overgrown epitaxial surface semiconductor layer 22' is overgrown to the same dimensions as the epitaxial surface semiconductor layer 22 that is illustrated in FIG. 3 and FIG. 16. However, in comparison with FIG. 16, dislocation lines 23 are much closer to the hard mask layer 16' due to recess of the surface semiconductor layers 14''' beneath the hard mask layer 16'.

Figure 23:
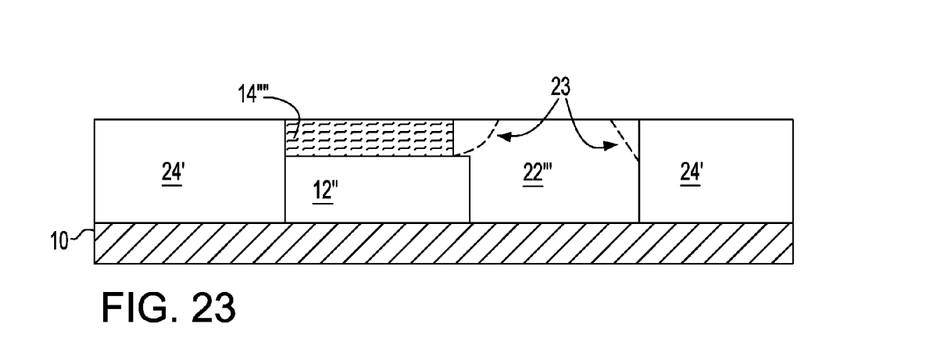

FIG. 23 shows the results of further processing of the semiconductor structure of FIG. 22. FIG. 23 shows the results of further processing generally in accordance with the processing of FIG. 4 to FIG. 10, but wherein a surface semiconductor layer 14'''' is recessed with respect to an epitaxial surface semiconductor layer 22''' and to the buried dielectric layer 12''. The epitaxial surface semiconductor layer 22''' that is illustrated in FIG. 23 has a reduced lateral encroachment of a second crystallographic orientation material due to the recesses of the surface semiconductor layers 14''' that is illustrated in FIG. 20 with respect to the hard mask layer 16' and the buried dielectric layer 12'.

Figure 24:
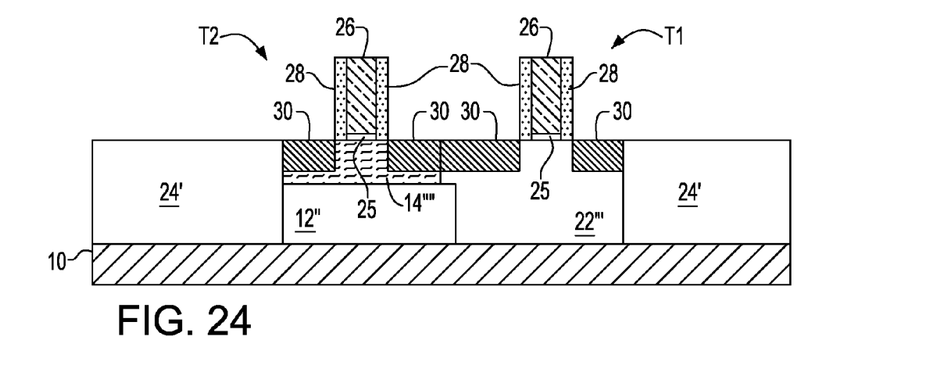

The semiconductor structure that is illustrated in FIG. 23 may be further processed in accordance with the second embodiment as illustrated in FIG. 18, to provide a CMOS structure in accordance with the schematic cross-sectional diagram of FIG. 24. A difference between the two structures provides that surface semiconductor layer 14'''' has a recess with respect to the buried dielectric layer 12''. Another difference between the two structures derives from an inhibited formation of the second crystallographic phase within the semiconductor structure of FIG. 23 in comparison with the semiconductor structure of FIG. 17, thus yielding enhanced performance of semiconductor device T2 located within the semiconductor structure.

FIG. 23 and FIG. 24 show schematic cross-sectional diagrams of a semiconductor structure in accordance with a third embodiment of the invention. The semiconductor structures comprise an epitaxial surface semiconductor layer 22''' that is grown from both a semiconductor substrate 10 having a first crystallographic orientation and a surface semiconductor layer 14''' having a second crystallographic orientation different from the first crystallographic orientation. Since the surface semiconductor layer 14''' within the third embodiment is recessed beneath a hard mask layer 16', a dislocation plane 23 between the first crystallographic orientation and the second crystallographic orientation is more outward in comparison with the second embodiment. Thus, within the third embodiment in comparison with the second embodiment, an epitaxial surface semiconductor layer 22''' is formed primarily with a first crystallographic orientation, and with a second crystallographic orientation at only a periphery of the epitaxial surface semiconductor layer 22'''. In turn, the primary first crystallographic plane of the epitaxial surface semiconductor layer 22''' provides enhanced performance of the device T1.

The preferred embodiments of the invention are illustrative of the invention rather than limiting of the invention. Revisions and modifications may be made to methods, materials, structures and dimensions of a semiconductor structure in accordance with the embodiments of the invention, while still providing a semiconductor structure in accordance with the invention, further in accordance with the accompanying claims.

What is claimed is:

1. A method for fabricating a semiconductor structure comprising:

forming an aperture through a masking layer, a surface semiconductor layer and a buried dielectric layer to expose a semiconductor substrate within a semiconductor structure comprising the semiconductor substrate, the buried dielectric layer located thereupon, the surface semiconductor layer located thereupon, and the masking layer located thereupon, the surface semiconductor layer exposed within the aperture having a lateral recess with respect to the buried dielectric layer exposed within the aperture and the masking layer exposed within the aperture, the semiconductor substrate having a first crystallographic orientation and the surface semiconductor layer having a second crystallographic orientation different from the first crystallographic orientation; and growing an epitaxial surface semiconductor layer upon the semiconductor substrate exposed within the aperture.

2. The method of claim 1 wherein the recess has a linewidth from about one half thickness to about one full thickness of the surface semiconductor layer.

3. The method of claim 1 wherein the recess inhibits a second crystallographic phase growth within the epitaxial surface semiconductor layer.

4. The method of claim 1 further comprising:

stripping the hard mask layer from the surface semiconductor layer; and forming a first device within the epitaxial surface semiconductor layer; and forming a second device within the surface semiconductor layer.

5. The method of claim 4 wherein:

the first crystallographic orientation is a 110 crystallographic orientation and the first device is a pFET; and the second crystallographic orientation is a 100 crystallographic orientation and the second device an nFET.

6. The method of claim 1 wherein the surface semiconductor layer and the semiconductor substrate comprise the same semiconductor material.

7. The method of claim 1 wherein the forming the aperture uses at least in part an isotropic etch method that provides the recess of the surface semiconductor layer with respect to the masking layer.

* * * * *